(12) United States Patent
Cao

(10) Patent No.: US 11,972,792 B2
(45) Date of Patent: Apr. 30, 2024

(54) INTEGRATED CIRCUIT STRUCTURE AND MEMORY STRUCTURE

(71) Applicant: CHANGXIN MEMORY TECHNOLOGIES, INC., Hefei (CN)

(72) Inventor: Lingling Cao, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 100 days.

(21) Appl. No.: 17/804,910

(22) Filed: Jun. 1, 2022

(65) Prior Publication Data

US 2023/0282271 A1    Sep. 7, 2023

(30) Foreign Application Priority Data

Mar. 4, 2022    (CN) .......................... 202210210773.7

(51) Int. Cl.
*G11C 11/4096*    (2006.01)
(52) U.S. Cl.
CPC ................ *G11C 11/4096* (2013.01)

(58) Field of Classification Search
CPC ............ G11C 11/4096; G11C 11/4091; G11C 11/4097; G11C 5/025; G11C 5/06
See application file for complete search history.

(56) References Cited

U.S. PATENT DOCUMENTS

| | | | |
|---|---|---|---|
| 2017/0285998 A1* | 10/2017 | Mathuria | ................. G11C 8/12 |
| 2019/0347219 A1 | 11/2019 | Ho | |
| 2021/0406123 A1* | 12/2021 | Nakanishi | ........... G11C 11/4096 |

\* cited by examiner

*Primary Examiner* — Jay W. Radke
(74) *Attorney, Agent, or Firm* — Cooper Legal Group, LLC

(57) ABSTRACT

An integrated circuit structure includes a first bank group and a second bank group sharing one set of data read and write drive circuits, and the set of data read and write drive circuits includes: a read control module that is connected to a read data bus, a first read and write data bus, and a second read and write data bus, and is configured to read data of the first bank group onto the read data bus, and to read data of the second bank group onto the read data bus; and a write control module that is connected to a write data bus, the first read and write data bus, and the second read and write data bus, and is configured to write data of the write data bus into the first bank group, and to write data of the write data bus into the second bank group.

18 Claims, 5 Drawing Sheets

INTEGRATED CIRCUIT STRUCTURE AND MEMORY STRUCTURE

CROSS-REFERENCE TO RELATED APPLICATIONS

This application claims the priority of Chinese Patent Application No. 202210210773.7 submitted to the Chinese Intellectual Property Office on Mar. 4, 2022, the disclosure of which is incorporated herein in its entirety by reference.

TECHNICAL FIELD

The present disclosure relates to the technical field of integrated circuits, and specifically to an integrated circuit structure and a memory structure using the integrated circuit structure.

BACKGROUND

In the design of current DDR4 (the fourth generation of DRAM), a memory array inside the DRAM is divided into 4 bank groups (BGs) due to the existence of the BGs [1:0]. Alternate reading and writing between the different BGs can improve the access efficiency of the DRAM. In this design, data connections to the different BGs are merged in a central region of the 4 BGs, and a data bus is shared to transmit data to a data queue (DQ). Since the data connections need to reach each BG through long metal wires, drive circuits for read and write data lines in the central region need a large size. This size is multiplied by a data line width of 72 bits, so that data read and write drive circuits of the 4 BGs occupy a large layout area, there are long data lines from the DQ, and the data lines have large loading.

For example, the layout area of the central region is large in both an X direction (an extension direction of the data lines that are connected to the DQ) and a Y direction (perpendicular to the X direction, and an extension direction of the data lines that are connected to each BG). The large area in the X direction increases the loading of the data lines from a DQ terminal, and the large area in the Y direction increases the loading of the data lines at a BG terminal. On the layout and wiring, the wiring in the X direction is placed on a top metal layer, and the wiring in the Y direction will is placed on a first metal layer, so the loading in the Y direction is more serious.

It should be noted that the information disclosed above is merely intended to facilitate a better understanding of the background of the present disclosure, and therefore may include information that does not constitute the prior art known to those of ordinary skill in the art.

SUMMARY

An integrated circuit structure is provided according to a first aspect of the present disclosure, and includes a first bank group and a second bank group, the first bank group and the second bank group share one set of data read and write drive circuits. The set of data read and write drive circuits includes: a read control module that is connected to a read data bus, a first read and write data bus, and a second read and write data bus, and is configured to read data of the first bank group onto the read data bus through the first read and write data bus, and to read data of the second bank group onto the read data bus through the second read and write data bus; and a write control module that is connected to a write data bus, the first read and write data bus, and the second read and write data bus, and is configured to write data of the write data bus into the first bank group through the first read and write data bus, and to write data of the write data bus into the second bank group through the second read and write data bus. The read data bus includes a plurality of read data lines, the write data bus includes a plurality of write data lines, and the plurality of read data lines and the plurality of write data lines are arranged side by side in a staggered (alternating) manner.

A memory structure is provided according to a second aspect of the present disclosure, and includes: a first bank group and a second bank group, jointly arranged in a first layout region, and sharing one integrated circuit structure having an instance of the above set of data read and write drive circuits; and a third bank group and a fourth bank group, jointly arranged in a second layout region, and sharing another integrated circuit structure having another instance of the above set of data read and write drive circuits. The first bank group and the second bank group are arranged in parallel in a first direction, the third bank group and the fourth bank group are arranged in parallel in the first direction, the first layout region and the second layout region are arranged in parallel in a second direction, and the second direction is perpendicular to the first direction.

It should be understood that the above general description and the following detailed description are only exemplary and explanatory, and should not be construed as a limitation to the present disclosure.

BRIEF DESCRIPTION OF THE DRAWINGS

The accompanying drawings incorporated into the specification and constituting part of the specification illustrate the embodiments of the present disclosure, and serve, together with the specification, to explain the principles of the present disclosure. Apparently, the drawings in the following description show merely some embodiments of the present disclosure, and those of ordinary skill in the art may still derive other drawings from these drawings without creative efforts.

DETAILED DESCRIPTION

Figure 1:
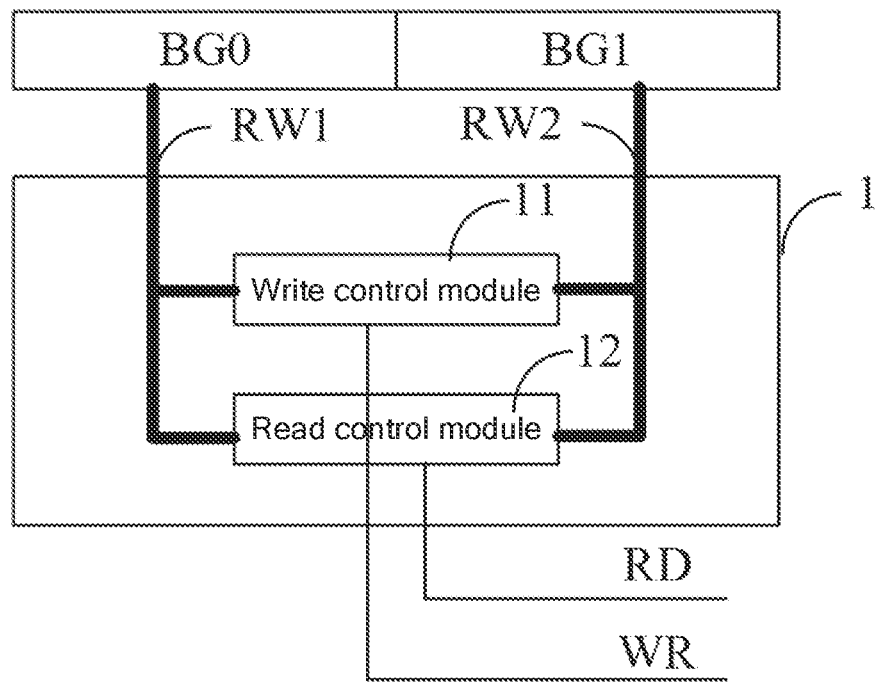
FIG. 1 is a schematic structural diagram of an integrated circuit structure according to one exemplary embodiment of the present disclosure.

The exemplary implementations are described more comprehensively below with reference to the accompanying drawings. However, the exemplary implementations can be implemented in various forms and should not be construed as being limited to examples described herein. On the contrary, these implementations are provided such that the present disclosure is more comprehensive and complete, and fully conveys the concept of the exemplary implementations to those skilled in the art. The described features, structures, or characteristics may be incorporated into one or more implementations in any suitable manner. In the following description, many specific details are provided to give a full understanding of the implementations of the present disclosure. However, those skilled in the art will be aware that the technical solutions of the present disclosure may be practiced with one or more of the specific details omitted, or other methods, components, apparatuses, steps, and the like may be used. In other cases, the publicly known technical solutions are not illustrated or described in detail, so as to avoid overshadowing and obscuring various aspects of the present disclosure.

In addition, the accompanying drawings are merely schematic diagrams of the present disclosure, and identical reference numerals in the accompanying drawings denote identical or similar parts. Therefore, repeated description thereof will be omitted. Some of the block diagrams shown in the accompanying drawings are functional entities, and do not necessarily correspond to physically or logically independent entities. These functional entities may be implemented in the form of software, or implemented in one or more hardware modules or integrated circuits, or implemented in different networks and/or processor apparatuses and/or microcontroller apparatuses.

The following describes in detail the exemplary implementations of the present disclosure with reference to the accompanying drawings.

FIG. 1 is a schematic structural diagram of an integrated circuit structure according to one exemplary embodiment of the present disclosure.

Referring to FIG. 1, the integrated circuit structure may include:
- a first bank group BG0 and a second bank group BG1 sharing one set of data read and write drive circuits 1. The data read and write drive circuits 1 includes:
- a write control module 11, connected to a write data bus WR, the first read and write data bus RW1, and the second read and write data bus RW2, and configured to write data of the write data bus WR into the first bank group BG0 through the first read and write data bus RW1, or write data of the write data bus WR into the second bank group BG1 through the second read and write data bus RW2; and
- a read control module 12, connected to a read data bus RD, the first read and write data bus RW1, and the second read and write data bus RW2, and configured to read data of the first bank group BG0 onto the read data bus RD through the first read and write data bus RW1, or read data of the second bank group BG1 onto the read data bus RD through the second read and write data bus RW2.

The read data bus RD includes a plurality of read data lines, the write data bus WR includes a plurality of write data lines, and the plurality of read data lines and the plurality of write data lines are arranged in a staggered manner.

To reduce a layout area occupied by the set of data read and write drive circuits, embodiments of the present disclosure merge identical control circuits in different BGs as much as possible. Since BG0 and BG1 share one set of read and write data buses (RD+WR), receivers having different BG write functions can be merged, and drivers having different BG read functions can be merged, thereby reducing the overall area of the data read and write drive circuits, and reducing a volume of a memory.

The write control module 11 and the read control module 12 are described below.

Figure 2:
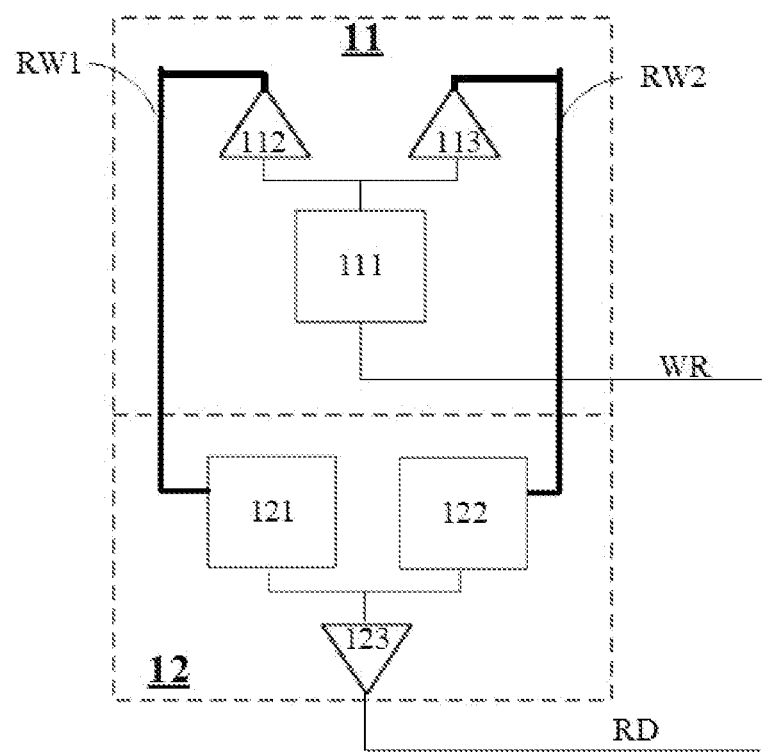
FIG. 2 is a schematic structural diagram of a write control module and a read control module according to one embodiment of the present disclosure.

FIG. 2 is a schematic structural diagram of a write control module and a read control module according to one embodiment of the present disclosure.

Referring to FIG. 2, in one embodiment, the write control module 11 includes:
- a write control unit 111, connected to the write data bus WR;
- a first write drive unit 112, a first terminal of the first write drive unit 112 being connected to the write control unit 111, and a second terminal of the first write drive unit 112 being connected to the first bank group BG0 through the first read and write data bus RW1; and
- a second write drive unit 113, a first terminal of the second write drive unit 113 being connected to the write control unit 111, and a second terminal of the second write drive unit 113 being connected to the second bank group BG1 through the second read and write data bus RW2.

The read control module 12 includes:
- a first read control unit 121, a first terminal of the first read control unit 121 being connected to the first bank group BG0 through the first read and write data bus RW1;
- a second read control unit 122, a first terminal of the second read control unit 122 being connected to the second bank group BG1 through the second read and write data bus RW2; and
- a read drive unit 123, connected to a second terminal of the first read control unit 121, a second terminal of the second read control unit 122, and the read data bus RD.

The first bank group BG0 and the second bank group BG1 have different data read and write times. That is, during data writing, data transmitted on the write data bus WR is written into the first bank group BG0 and the second bank group BG1 alternately; and during data reading, the data is read alternately from the first bank group BG0 and the second bank group BG1 onto the read data bus RD.

In view of the above analysis, the data of the first bank group BG0 and the data of the second bank group BG1 have a same write logic and complementary write timing. Therefore, according to the embodiments of the present disclosure, control of the write logic of the two bank groups is completed by using one write control unit 111, so as to write, in an alternative time-shared manner, data to be written on the write data bus WR into two write drive units (a first write drive unit 112 and a second write drive unit 113) that are connected to the first bank group BG0 and the second bank group BG1, thereby writing the data into the first bank group BG0 and the second bank group BG1 through the two write drive units.

It can be understood that the write control unit 111 can write a cache function for caching the data received from the write data bus WR to implement alternate time-shared writing for the first write drive unit 112 and the second write drive unit 113. The alternate time-shared writing means that the data to be written is written into the first write drive unit 112 during a first time period and written into the second write drive unit 113 during a second time period. Each of the first time period and the second time period includes a plurality of time periods, an end time point of one first time period is close to a start time point of one second time period, and an end time point of one second time period is close to a start time point of the next first time period.

Similarly, in view of the above analysis, during data reading, the data of the first bank group BG0 and the data of the second bank group BG1 have a same read logic and complementary read timing. Therefore, according to the embodiments of the present disclosure, the data is read from the first bank group BG0 and the second bank group BG1 by using two read control units (a first read control unit 121 and a second read control unit 122) that are respectively connected to the first bank group BG0 and the second bank group BG1, then outputted to a read drive unit 123 in a time-shared manner, and sent to the read data bus RD through the read drive unit 123.

Each of the first read control unit 121 and the second read control unit 122 may have a read cache function for caching the data read from the first bank group BG0 and the second bank group BG1, thereby alternately outputting the data to the read drive unit 123 in a time-shared manner. The alternate time-shared outputting means that the read drive unit 123 reads the data from the first read control unit 121 during a third time period and reads the data from the second read control unit 122 during a fourth time period. Each of the third time period and the fourth time period includes a plurality of time periods, an end time point of one third time period is close to a start time point of one fourth time period, and an end time point of one fourth time period is close to a start time point of the next third time period.

Thus, in the embodiments of the present disclosure, one write control unit and one read drive unit perform read and write control for two bank groups, greatly saving the circuit layout area of the data read and write drive circuit. In addition, since read and write operations cannot be performed at the same time, the staggered arrangement of the plurality of read data lines and the plurality of write data lines is conducive to realizing that the read data lines and the write data lines are mutually shielding lines, thereby suppressing signal interference between the adjacent read data lines or the adjacent write data lines.

Figure 3:
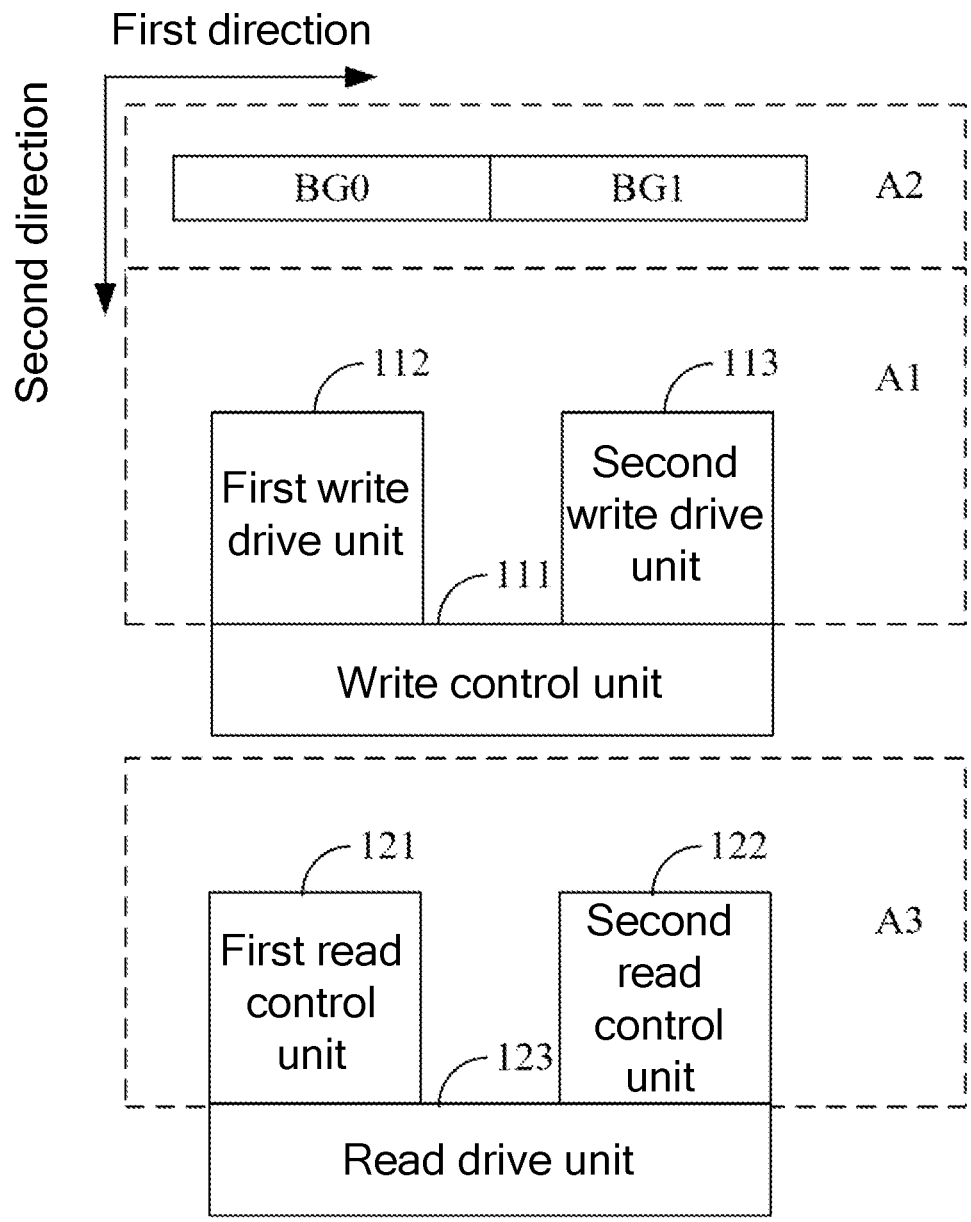
FIG. 3 is a schematic diagram of layout of a write control module and a read control module according to one embodiment of the present disclosure.

FIG. 3 is a schematic diagram of layout of a write control module and a read control module according to one embodiment of the present disclosure.

Referring to FIG. 3, when circuit layout is performed, the write control module 11 and the read control module 12 can be arranged side by side to reduce the layout area of the data read and write drive circuits as much as possible.

In the embodiment shown in FIG. 3, the first write drive unit 112 and the second write drive unit 113 are located in a first region A1, the first write drive unit 112 and the second write drive unit 113 are arranged in parallel in a first direction, the write control unit 111 and the first region A1 are arranged in parallel in a second direction, and the second direction is perpendicular to the first direction.

The first bank group BG0 and the second bank group BG1 are located in a second region A2, and the second region A2, the first region A1, and the write control unit 111 are sequentially arranged in the second direction. In one embodiment, the first bank group BG0 and the second bank group BG1 are arranged in parallel in the first direction.

The first read control unit 121 and the second read control unit 122 are located in a third region A3, the first read control unit 121 and the second read control unit 122 are arranged in parallel in the first direction, and the third region A3 and the read drive unit 123 are arranged in parallel in the second direction. In one embodiment, the second region A2, the third region A3, and the read drive unit 123 are sequentially arranged in the second direction.

The first write drive unit 112 is located in a first column, the second write drive unit 113 is located in a second column, and the write control unit 111 occupies the first column and the second column in the first direction. The first read control unit 121 is located in a first column, the second read control unit 122 is located in a second column, and the read drive unit 123 occupies the first column and the second column in the first direction. According to the layout method of two columns and two rows shown in FIG. 3, the layout of the data read and write drive circuit can be minimized.

In the embodiment shown in FIG. 3, the second region A2, the first region A1, and the third region A3 are sequentially arranged in the second direction. In other embodiments of the present disclosure, the sequence of the first region A1 and the third region A3 can also be adjusted, or the arrangement sequence of the second region A2, the first region A1, and the third region A3 is adjusted, which is not specifically limited in the present disclosure.

Figure 4:
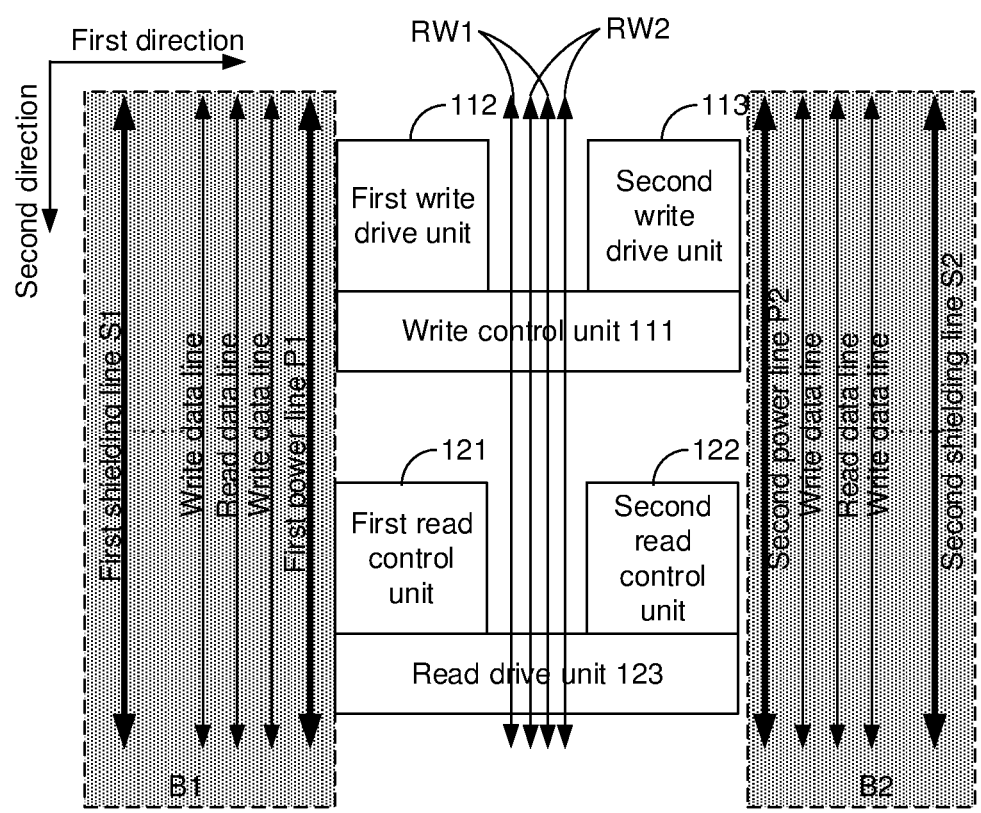
FIG. 4 is a schematic diagram of layout and wiring of a read control module and a write control module according to one embodiment of the present disclosure.

FIG. 4 is a schematic diagram of layout and wiring of a read control module and a write control module according to one embodiment of the present disclosure.

Referring to FIG. 4, in one embodiment, a gap extending in the second direction is provided between the first write drive unit 112 and the second write drive unit 113, and a projection of one section of the first read and write data bus RW1 and a projection of one section of the second read and write data bus RW2 are located in the gap.

In one embodiment, the first read and write data bus RW1 and the second read and write data bus RW2 are arranged in a staggered manner. Since the first read and write data bus and the second read and write data bus do not operate at the same time, the two can serve as mutually shielding lines through staggered arrangement.

In addition, in the embodiment shown in FIG. 4, the plurality of read data lines and the plurality of write data lines are arranged in a first wiring region B1 and a second wiring region B2 also in a staggered manner; the first wiring region B1, the read control module 12, and the second wiring region B2 are arranged in parallel in the first direction; the read data line and the write data line extend in the second direction in the first wiring region and the second wiring region; and the second direction is perpendicular to the first direction.

In one embodiment, the side of the first wiring region B1 adjacent to the read control module 12 is provided with a first power line P1 extending in the second direction, and the side of the second wiring region B2 adjacent to the read control module 12 is provided with a second power line P2 extending in the second direction.

In one embodiment, the side of the first wiring region B1 away from the read control module 12 is provided with a first shielding line 51 extending in the second direction, and the side of the second wiring region B2 away from the read control module 12 is provided with a second shielding line S2 extending in the second direction.

Among the data lines from a DQ, the write data lines and the read data lines are routed separately and can be mutually shielding lines. However, after passing through a central region, the data lines are not divided into the write data lines and the read data lines anymore, and an additional set of lines is needed for shielding, which increases the layout area. In the embodiments of the present disclosure, after BG0 and BG1 are merged, since BG0 and BG1 do not operate at the same time, the data lines of the two bank groups can also be mutually shielding lines, thereby increasing the utilization rate of the lines in the layout, and reducing the layout area.

Therefore, during BG0 and BG1 being merged, to make the read data lines and the write data lines be mutually shielding lines, the same set of read drive units and write drive units can be placed in the second direction. For the convenience of wiring, single drive units are divided into one column or a combination of two columns.

During BG0 and BG1 being merged, the write drive units cannot be merged and can be divided into single columns. However, the read drive units of the two bank groups can be merged. To make the read data lines and the write data lines be mutually shielding lines, the read drive units need to be divided into two columns, the read data lines and the write data lines in the read data bus and the write data bus are then routed on two sides, and shielding lines are added to the outermost edges of the data lines to prevent other routings from influencing the data lines. Moreover, the data lines close to the drive units use the power lines as shielding lines, without needing additional shielding lines.

Figure 5:
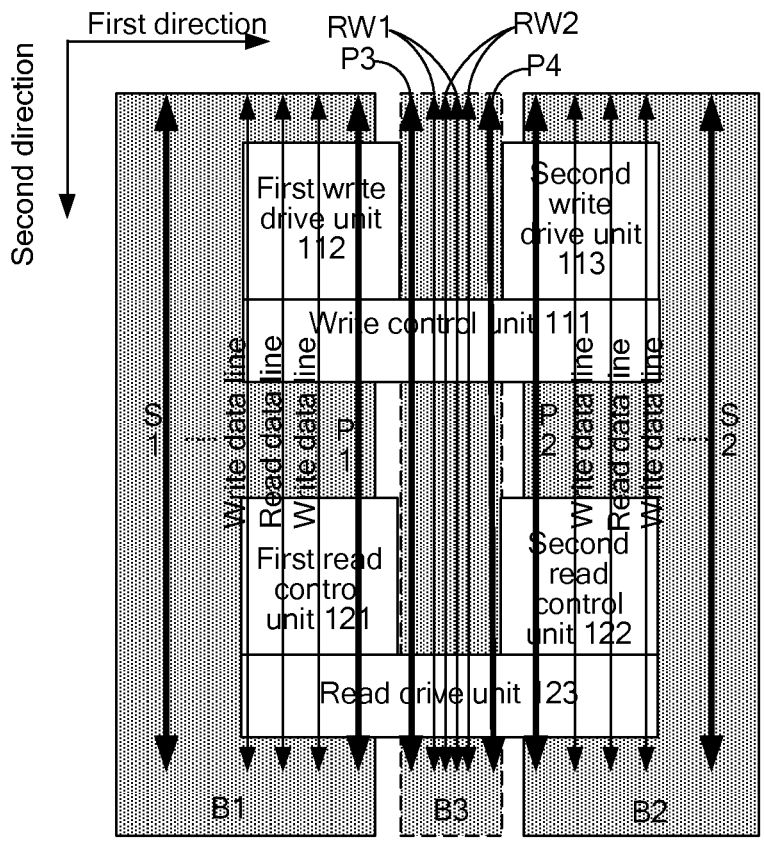
FIG. 5 is a schematic diagram of layout and wiring of a read control module and a write control module according to another embodiment of the present disclosure.

FIG. 5 is a schematic diagram of layout and wiring of a read control module and a write control module according to another embodiment of the present disclosure.

Referring to FIG. 5, in one embodiment, the first read and write data bus RW1 and the second read and write data bus RW2 extend in a third wiring region B3 in the second direction, the third wiring region B3 is arranged between the first wiring region B1 and the second wiring region B2, the side of the third wiring region B3 adjacent to the first wiring region B1 is provided with a third power line P3, the side of the third wiring region B3 adjacent to the second wiring region B2 is provided with a fourth power line P4, and both the third power line P3 and the fourth power P4 line extend in the second direction.

After the write drive units and the read drive units are divided into double rows or a single row, a distance between the two rows is widened, and the read and write data buses from the central region to the bank groups are arranged. During the arrangement, the data buses of BG0 and BG1 (i.e., the first read and write data bus RW1 and the second read and write data bus RW2) are alternately arranged. This set of data buses uses the power lines as shielding layers on the two sides close to the write drive units, without needing any other shielding layers, so that high utilization rate of the lines is achieved, and the wiring area is also reduced.

In addition, during actual layout, circuits of the write control module 11 and the read control module 12 can be partially arranged on a same layer, and the data lines are arranged on other layers and can be arranged on a same layer or different layers.

As shown in FIG. 5, in one embodiment, the first wiring region B1 and the second wiring region B2 can be respectively arranged in regions that have projection areas overlapping the first write drive unit 112 and the second write drive unit 113, thereby reducing, through multilayer wiring, the layout area occupied by the central region, the wiring length, and the load of the data lines.

Figure 6:
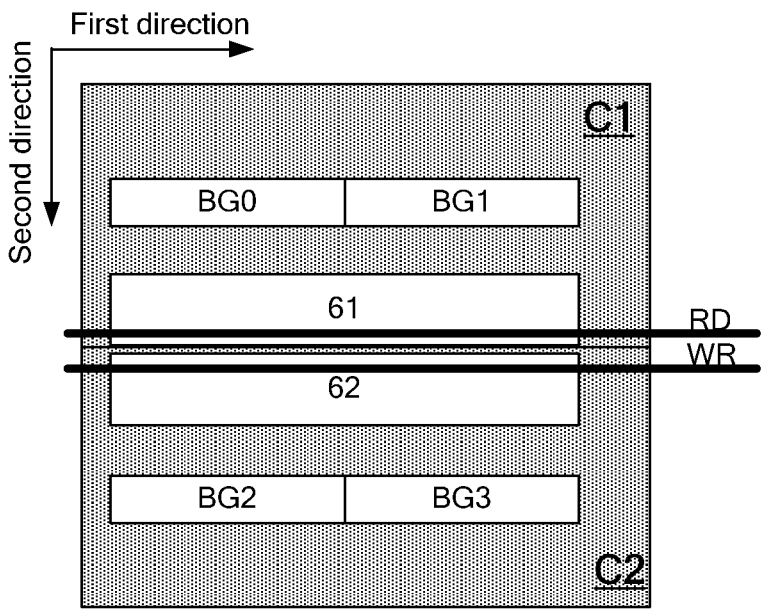
FIG. 6 is a schematic diagram of a memory structure according to one embodiment of the present disclosure.

FIG. 6 is a schematic diagram of a memory structure according to one embodiment of the present disclosure.

Referring to FIG. 6, in one embodiment, the memory structure 600 may include:

the first bank group BG0 and the second bank group BG1, jointly arranged in a first layout region C1, and sharing one set of the integrated circuit structure 61 according to the embodiments shown in FIG. 1 to FIG. 5, the integrated circuit structure 61 being arranged in the first layout region C1; and a third bank group BG2 and a fourth bank group BG3, jointly arranged in a second layout region C2, and sharing another set of the integrated circuit structure 62 according to the embodiments shown in FIG. 1 to FIG. 5, the integrated circuit structure 62 being arranged in the second layout region C2.

The first bank group BG0 and the second bank group BG1 are arranged in parallel in the first direction, the third bank group BG2 and the fourth bank group BG3 are arranged in parallel in the first direction, the first layout region C1 and the second layout region C2 are arranged in parallel in the second direction, and the second direction is perpendicular to the first direction. The first direction is an extension direction of the read data bus RD and the write data bus WR that are connected to the DQ terminal.

In one embodiment, the first bank group BG0, the second bank group BG1, the third bank group, and the fourth bank group are commonly connected to the read data bus RD and the write data bus WR, the read data bus RD includes a plurality of read data lines, the write data bus WR includes a plurality of write data lines, and the plurality of read data lines and the plurality of write data lines extend in the second direction.

After the merging, the central region is changed from original 4 layout blocks to 2 layout blocks. Before the change, each layout block corresponds to one bank group, and is responsible for reading and writing of the corresponding bank group. After the change, each layout block corresponds to two bank groups, and enables alternate reading and writing. Furthermore, the integrated circuit structure 61 and the integrated circuit structure 62 having a smaller layout area achieve a smaller layout area of the central region.

Figure 7:
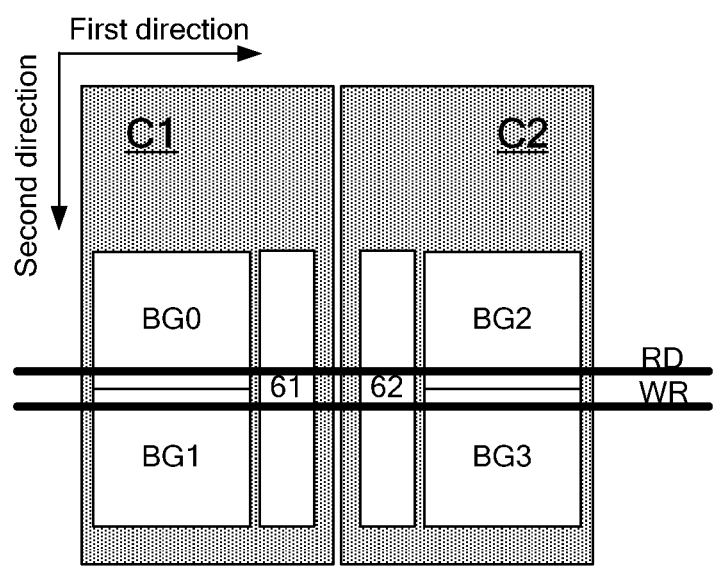
FIG. 7 is a schematic diagram of a memory structure according to another embodiment of the present disclosure.

FIG. 7 is a schematic diagram of a memory structure according to another embodiment of the present disclosure.

Referring to FIG. 7, in another embodiment, the first layout region C1 and the second layout region C2 can also be arranged in parallel in the first direction. However, in terms of the floor plan of wiring, to reduce the load of the data lines at the BG terminal, the embodiment shown in FIG. 6 can be prioritized in the floor plan of the central region.

According to the present disclosure, the data-shared bus parts are extended by improving the drive circuit structure for the read and write data buses and the data lines between the different BGs and the layout design, and the BG control logic is optimized by merging the read drive units and the write control units, so that the circuit structure for driving the read and write buses can be simplified, and the area of the layout design can be saved. The design according to the embodiments of the present disclosure can be applied to circuits for driving DDR4 central data bus and BG data lines, but is not limited to this scope, and circuit systems including data bus control and distribution data can all use this design.

It should be noted that although a number of modules or units of the device for execution are mentioned in the detailed description above, this division is not mandatory. In fact, according to the implementations of the present disclosure, the features and functions of two or more modules or units described above may be embodied in one module or unit. Correspondingly, the features and functions of a module or unit described above may be further divided into a plurality of modules or units to be embodied.

Those skilled in the art may easily figure out other implementations of the present disclosure after considering the specification and practicing the invention disclosed herein. The present application is intended to cover any variations, purposes or adaptive changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and concept of the present disclosure are specified by the appended claims.

The invention claimed is:

1. An integrated circuit structure, comprising a first bank group and a second bank group, wherein the first bank group and the second bank group share one set of data read and write drive circuits, and the set of data read and write drive circuits comprises:
a read control module that is connected to a read data bus, a first read and write data bus, and a second read and write data bus, and the read control module is configured to read data of the first bank group onto the read data bus through the first read and write data bus, and to read data of the second bank group onto the read data bus through the second read and write data bus; and
a write control module that is connected to a write data bus, the first read and write data bus, and the second read and write data bus, and the write control module is configured to write data of the write data bus into the first bank group through the first read and write data bus, and to write data of the write data bus into the second bank group through the second read and write data bus;
wherein the read data bus comprises a plurality of read data lines, the write data bus comprises a plurality of write data lines, and the plurality of read data lines and the plurality of write data lines are arranged in an alternating manner.

2. The integrated circuit structure according to claim 1, wherein the write control module comprises:
a write control unit, connected to the write data bus;
a first write drive unit, a first terminal of the first write drive unit being connected to the write control unit, and a second terminal of the first write drive unit being connected to the first bank group through the first read and write data bus; and
a second write drive unit, a first terminal of the second write drive unit being connected to the write control unit, and a second terminal of the second write drive unit being connected to the second bank group through the second read and write data bus.

3. The integrated circuit structure according to claim 2, wherein the first write drive unit and the second write drive unit are located in a first region, the first write drive unit and the second write drive unit are arranged in parallel in a first direction, the write control unit and the first region are arranged in parallel in a second direction, and the second direction is perpendicular to the first direction.

4. The integrated circuit structure according to claim 3, wherein the first write drive unit is located in a first column, the second write drive unit is located in a second column, and the write control unit occupies the first column and the second column in the first direction.

5. The integrated circuit structure according to claim 3, wherein a gap extending in the second direction is provided between the first write drive unit and the second write drive unit, and a projection of a section of the first read and write data bus and a projection of a section of the second read and write data bus are located in the gap.

6. The integrated circuit structure according to claim 3, wherein the first bank group and the second bank group are located in a second region, and the second region, the first region, and the write control unit are sequentially arranged in the second direction.

7. The integrated circuit structure according to claim 1, wherein the read control module comprises:
a first read control unit, a first terminal of the first read control unit being connected to the first bank group through the first read and write data bus;
a second read control unit, a first terminal of the second read control unit being connected to the second bank group through the second read and write data bus; and
a read drive unit, connected to a second terminal of the first read control unit, a second terminal of the second read control unit, and the read data bus.

8. The integrated circuit structure according to claim 7, wherein the first read control unit and the second read control unit are located in a third region, the first read control unit and the second read control unit are arranged in parallel in a first direction, the third region and the read drive unit are arranged in parallel in a second direction, and the second direction is perpendicular to the first direction.

9. The integrated circuit structure according to claim 7, wherein the first read control unit is located in a first column, the second read control unit is located in a second column, and the read drive unit occupies the first column and the second column in a first direction.

10. The integrated circuit structure according to claim 8, wherein the first bank group and the second bank group are located in a second region, and the second region, the third region, and the read drive unit are sequentially arranged in the second direction.

11. The integrated circuit structure according to claim 5, wherein the first read and write data bus and the second read and write data bus are arranged in the alternating manner.

12. The integrated circuit structure according to claim 1, wherein the first bank group and the second bank group are arranged in parallel in a first direction.

13. The integrated circuit structure according to claim 1, wherein the plurality of read data lines and the plurality of write data lines are arranged in a first wiring region and a second wiring region in the alternating manner; the first wiring region, the read control module, and the second wiring region are arranged in parallel in a first direction; the read data lines and the write data lines extend in a second direction in the first wiring region and the second wiring region; and the second direction is perpendicular to the first direction.

14. The integrated circuit structure according to claim 13, wherein a side of the first wiring region adjacent to the read control module is provided with a first power line extending in the second direction, and a side of the second wiring region adjacent to the read control module is provided with a second power line extending in the second direction.

15. The integrated circuit structure according to claim 14, wherein a side of the first wiring region away from the read control module is provided with a first shielding line extending in the second direction, and a side of the second wiring region away from the read control module is provided with a second shielding line extending in the second direction.

16. The integrated circuit structure according to claim 13, wherein the first read and write data bus and the second read and write data bus extend in a third wiring region in the second direction, the third wiring region is arranged between the first wiring region and the second wiring region, a side of the third wiring region adjacent to the first wiring region is provided with a third power line, a side of the third wiring region adjacent to the second wiring region is provided with a fourth power line, and both the third power line and the fourth power line extend in the second direction.

17. A memory structure, comprising:
the first bank group and the second bank group, jointly arranged in a first layout region, and sharing one integrated circuit structure having an instance of the set of data read and write drive circuits according to claim 1; and
a third bank group and a fourth bank group, jointly arranged in a second layout region, and sharing another integrated circuit structure having another instance of the set of data read and write drive circuits according to claim 1;
wherein the first bank group and the second bank group are arranged in parallel in a first direction, the third bank group and the fourth bank group are arranged in parallel in the first direction, the first layout region and the second layout region are arranged in parallel in a second direction, and the second direction is perpendicular to the first direction.

18. The memory structure according to claim 17, wherein the first bank group, the second bank group, the third bank group, and the fourth bank group are commonly connected to the read data bus and the write data bus, the read data bus comprises the plurality of read data lines, the write data bus comprises the plurality of write data lines, and the plurality of read data lines and the plurality of write data lines extend in the second direction.

* * * * *